United States Patent [19]

Kudman et al.

[11] 3,737,345

[45] June 5, 1973

[54] PROTECTED THERMOELECTRIC ELEMENTS AND METHOD OF PROTECTING SAME

[75] Inventors: Irwin Kudman, Trenton; Carl Michael Schmelz, Columbus, both of N.J.

[73] Assignee: RCA Corporation, New York, N.Y.

[22] Filed: Oct. 24, 1969

[21] Appl. No.: 869,342

[52] U.S. Cl. ..................136/238, 117/106, 117/201, 136/236, 148/31.5

[51] Int. Cl. ..............................................H01v 1/18

[58] Field of Search.............................136/236, 238; 117/201; 148/6.3, 31.5; 252/62.3 T

[56] References Cited

UNITED STATES PATENTS 2,952,725 9/1960 Evans et al. ......................136/237 X 3,070,644 12/1960 Van Der Grinten et al. ..136/205 UX 3,444,006 5/1969 Duncan et al. .......................136/238

*Primary Examiner*—Benjamin R. Padgett

*Assistant Examiner*—Harvey E. Behrend

*Attorney*—Glenn H. Bruestle

[57] ABSTRACT

A thermoelectric element, comprising a body of lead telluride and/or lead selenide, is provided with a protective coating of a compound of tellurium and/or selenium and one of the rare earth elements, gadolinium, terbium, dysprosium, holmium, erbium, thulium, or ytterbium. The novel method comprises chemically reacting the heated, unprotected thermoelectric element, in an evacuated environment, with one of the aforementioned rare earth elements to form the protective coating as a refractory reaction product.

6 Claims, No Drawings

PROTECTED THERMOELECTRIC ELEMENTS AND METHOD OF PROTECTING SAME

BACKGROUND OF THE INVENTION

This invention relates generally to thermoelectric elements, and more particularly to novel protected thermoelectric elements and a novel method of protecting them from deterioration with use. The novel protected thermoelectric elements and the novel method of protecting them are particularly useful for providing thermoelectric elements that are adapted to operate efficiently in thermoelectric generators at temperatures above 200°C.

Among the most efficient thermoelectric elements for the thermoelectric generation of power at temperatures above 200°C are thermoelectric elements comprising PbTe (lead telluride) and/or PbSe (lead selenide), and alloys thereof. These thermoelectric elements, however, are thermally unstable at these high operating temperatures. For example, above about 450°C, these thermoelectric elements become volatile, and the continuous loss of material from them results in a continuous degradation of their power output, eventually resulting in a total loss of power output.

In order to operate a thermoelectric generator efficiently, its thermoelectric elements should be heated to as high a temperature as possible. It has been proposed to protect the thermoelectric elements against the aforementioned degradation by providing them with protective coatings. Glass coatings for the thermoelectric elements have been tried, but they have not been entirely satisfactory because they tended to crack and flake off with continued use. Encapsulating the thermoelectric generator in a hermetically sealed metal container filled with an inert gas has also been tried, but such encapsulation is relatively expensive and permits a rapid destruction of the thermoelectric elements if the container develops a gas leak.

The novel protected thermoelectric elements are provided with protective coatings that overcome the aforementioned disadvantages of the protective means of the prior-art.

SUMMARY OF THE INVENTION

A protected thermoelectric element comprises a body of PbTe and/or PbSe with a protective coating of a compound of Te and/or Se and one of the rare earth elements, Gd, Tb, Dy, Ho, Er, Tm, or Yb.

The novel method of protecting the thermoelectric elements comprises chemically reacting them, at the surfaces thereof to be protected, with one of the aforementioned rare earth elements to form a reaction-product protective coating.

DESCRIPTION OF THE PREFERRED EMBODIMENTS

Each of the novel protected thermoelectric elements comprises a body of at least a compound of lead and one of the chalcogens, tellurium or selenium, having a surface protected with a thin coating of a compound of tellurium and/or selenium and one of the rare earth elements, Gd, Tb, Dy, Ho, Er, Tm, or Yb. The bodies of these thermoelectric elements may be in any of the conventional shapes, such as discs or rods of circular or rectangular cross-section, for example, well known in the art. The novel protected thermoelectric elements are of the type usually referred to as lead base telluride thermoelectric elements, and, in addition to containing lead telluride, may be alloyed with compounds of GeTe, GeSe, SnTe, or PbSe. All of the novel protected lead base telluride thermoelectric elements, however, contain at least 50 percent of lead telluride and have a sodium chloride crystal structure.

In a typical thermoelectric generator, each of the novel thermoelectric elements would be either N-type or P-type, depending upon its doping. An example of a novel N-type lead base thermoelectric element may comprise, for example, an alloy consisting of essentially 91 to 99 mole percent of lead telluride and between 1 and 9 mole percent germanium telluride, plus a doping of from 0.03 to 0.1 mole percent of lead iodide. A typical P-type lead base thermoelectric element may consist of lead telluride doped with 0.7 mole percent of sodium.

The aforementioned lead base telluride thermoelectric elements are protected from disintegrating at high operating temperatures in thermoelectric generators, by coating them, at their surfaces to be protected, with a coating of a reaction product of the chalcogen (telluride and/or selenide) of the thermoelectric element and one of the rare earth elements, Gd, Tb, Dy, Ho, Er, Tm, or Yb. The protective coating need only between 1 and 10 microns in thickness to provide adequate protection. Such a protective coating provides a refractory compound whose crystal (NaCl type) structure, lattice perameters, and thermal coefficient of expansion closely match those of the thermoelectric element itself. The protective coating functions as a barrier to the loss of the volatile components of the lead base telluride thermoelectric elements during operation and is a refractory material whose melting point (in the neighborhood of 2000°C) is much higher than the temperature (about 600°C) for efficient operation of the thermoelectric elements.

The novel method of protecting a lead base telluride thermoelectric element comprises forming a protective coating, at the surface to be protected, of a reaction product of the chalcogen of the thermoelectric element and one of the rare earth elements, Gd, Tb, Dy, Ho, Er, Tm, or Yb. To carry out the novel method, the surface of the thermoelectric element to be protected is first cleaned, as by sand blasting and washing with methyl alcohol. The unprotected thermoelectric element is heated to a temperature of about 500°C in an evacuated environment of about $10^{-6}$ torr, as in an evacuated bell jar. The are earth element is heated in the evacuated environment to its melting point, and its vapor, in the presence of the heated thermoelectric element, is permitted to react with the heated thermoelectric element to form a reaction product of the rare earth element and the chalcogen (Te and/or Se) of the lead base telluride thermoelectric element. The chemical reaction is allowed to continue until the thickness of the reaction product, that is, the protective coating, is between 1 and 10 microns. The time of reaction depends upon many controllable factors, such as the amount of the rare earth element evaporated, its distance from the thermoelectric element, the volume of the evacuated environment, and the degree of vacuum of the evacuated environment, for example.

An example of carrying out the novel method of providing a protective coating for a lead base telluride thermoelectric element, comprising an N-type alloy of lead telluride and germanium telluride in a mole percentage ratio of about 95 percent lead telluride to about 5 percent germanium telluride is as follows: A body of the thermoelectric element in the shape of a rod about one-half inch long and three-eighths inch in diameter is cleaned by said blasting, followed by washing in methanol. The cleaned thermoelectric element is heated to a temperature of between 500° and 550°C in an evacuated environment of about $10^{-6}$ torr. A small quantity (1 g.) of dysprosium is melted in the evacuated environment at a distance of about 4 inches from the thermoelectric element, and the vapors of the dysprosium are permitted to react with the thermoelectric element for 3 minutes. The vapors of dysprosium are directed to the thermoelectric element through a glass tube 2 inches in diameter and 4 inches long. The reaction product formed at the surface of the thermoelectric element is dysprosium telluride with a thickness of between 3 and 10 microns.

When the rare earth element used is one of Gd, Tb, Ho, Er, Tm, or Yb, the novel method is the same as described supra, except that the melting points of the rare earth elements vary and the reaction times vary. The reaction time is a function of the aforementioned controllable factors.

Lead base telluride thermoelectric elements, some unprotected (control) and some protected by the novel method described supra, were tested at their operating temperatures. Each thermoelectric element was placed in a separate evaucated quartz tube, and the tube was heated for at least 60 hours in a furnace to a temperature of between 600° and 650°C. The tube was sufficiently long to project outside of the furnace to provide a "cold finger" for allowing a condensation of any volatile components from the heated zone. The (uncoated) unprotected thermoelectric elements exhibited marked thermal decompostion as evidenced by a loss of material, putting, and void formations. The novel coated (protected) thermoelectric elements, however, exhibited none of these destructive effects.

We claim:

1. A protected thermoelectric element comprising a body of a compound of lead and a chalcogen selected from the group consisting of tellurium and selenium, said thermoelectric element having a coating on the surface thereof of a compound of said selected chalcogen and a rare earth element selected from the group consisting of gadolinium, terbium, dysprosium, holmium, erbium, thulium, and ytterbium.

2. A protected thermoelectric element as described in claim 1 wherein the thickness of said coating is in the range between 1 and 10 microns.

3. A protected thermoelectric element as described in claim 1 wherein said coating on the surface of said thermoelectric element is a reaction product of said thermoelectric element and said selected rare earth element.

4. A thermoelectric element as described in claim 3 wherein the thickness of said coating is in the range between 1 and 10 microns.

5. A protected thermoelectric element comprising a body of a lead base telluride having a sodium chloride type crystal structure, and a coating on the surface of said thermoelectric element comprising a compound of tellurium and a rare earth element selected from the group consisting of Gd, Tb, Dy, Ho, Er, Tm, and Yb.

6. A protected thermoelectric element as described in claim 5 wherein, said coating is a reaction product of said thermoelectric element and said selected rare earth element, and said coating has the same type crystal structure as said lead base telluride.

* * * * *